(12) United States Patent
Satou et al.

(10) Patent No.: US 11,722,784 B2
(45) Date of Patent: *Aug. 8, 2023

(54) IMAGING DEVICE THAT GENERATES MULTIPLE-EXPOSURE IMAGE DATA

(71) Applicant: Panasonic Intellectual Property Management Co., Ltd., Osaka (JP)

(72) Inventors: Yoshiaki Satou, Kyoto (JP); Yasuo Miyake, Osaka (JP); Yasunori Inoue, Osaka (JP); Tokuhiko Tamaki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/834,558

(22) Filed: Jun. 7, 2022

(65) Prior Publication Data

US 2022/0303448 A1    Sep. 22, 2022

Related U.S. Application Data

(63) Continuation of application No. 17/243,101, filed on Apr. 28, 2021, now Pat. No. 11,388,349, which is a
(Continued)

(30) Foreign Application Priority Data

Jul. 10, 2015   (JP) .................................. 2015-138393

(51) Int. Cl.
*H04N 23/743*    (2023.01)
*H04N 25/53*    (2023.01)
(Continued)

(52) U.S. Cl.
CPC ............. *H04N 23/743* (2023.01); *G03B 7/08* (2013.01); *H04N 23/10* (2023.01); *H04N 23/73* (2023.01);
(Continued)

(58) Field of Classification Search
CPC .... H04N 5/2356; H04N 5/2353; H04N 5/353; H04N 5/3537; H04N 5/355;
(Continued)

(56) References Cited

U.S. PATENT DOCUMENTS 9,986,182 B2    5/2018  Miyake et al.
2007/0076093 A1    4/2007  Misawa
(Continued)

FOREIGN PATENT DOCUMENTS

CN    104280980 A    1/2015
JP    1-077377    3/1989
(Continued)

OTHER PUBLICATIONS

International Search Report of PCT application No. PCT/JP2016/002945, dated Sep. 6, 2016.
(Continued)

*Primary Examiner* — Ahmed A Berhan
(74) *Attorney, Agent, or Firm* — McDermott Will & Emery LLP

(57) ABSTRACT

An imaging device including pixels and processing circuitry, where the pixels capture a first image in a first exposure period within a frame period and capture a second image in a second exposure period within the frame period to generate multiple-exposure image data that include the first image and the second image in a multiplexed state, the second exposure period being different from the first exposure period, the second image being different from the first image in brightness or color, and the processing circuitry detects an
(Continued)

image of a moving subject from the multiple-exposure image data.

10 Claims, 15 Drawing Sheets

Related U.S. Application Data continuation of application No. 16/782,411, filed on Feb. 5, 2020, now Pat. No. 11,025,832, which is a continuation of application No. 15/497,193, filed on Apr. 25, 2017, now Pat. No. 10,594,948, which is a continuation of application No. PCT/JP2016/002945, filed on Jun. 20, 2016.

(51) Int. Cl.
| | |
|---|---|
| H04N 25/534 | (2023.01) |
| H04N 25/57 | (2023.01) |
| H04N 25/587 | (2023.01) |
| H04N 25/59 | (2023.01) |
| H04N 25/70 | (2023.01) |
| H04N 25/76 | (2023.01) |
| H01L 27/146 | (2006.01) |
| H04N 5/262 | (2006.01) |
| H04N 23/62 | (2023.01) |
| H04N 23/10 | (2023.01) |
| H04N 23/73 | (2023.01) |
| G03B 7/08 | (2021.01) |
| H04N 23/63 | (2023.01) |

(52) U.S. Cl.
CPC ........... *H04N 25/53* (2023.01); *H04N 25/534* (2023.01); *H04N 25/57* (2023.01); *H04N 25/587* (2023.01); *H04N 25/59* (2023.01); *H04N 25/70* (2023.01); *H04N 25/76* (2023.01); *H01L 27/14632* (2013.01); *H04N 5/2621* (2013.01); *H04N 23/631* (2023.01)

(58) Field of Classification Search
CPC .. H04N 5/35572; H04N 5/3559; H04N 5/369; H04N 5/374; H04N 9/045; H04N 5/232933; H04N 5/2621; H04N 5/2355; H04N 23/743; H04N 23/10; H04N 23/73; H04N 25/53; H04N 25/534; H04N 25/57; H04N 25/587; H04N 25/59; H04N 25/70; H04N 25/76; H04N 23/631; H04N 23/741; G03B 7/08; H01L 27/14632
See application file for complete search history.

(56) References Cited

U.S. PATENT DOCUMENTS

| | | | |
|---|---|---|---|
| 2007/0076108 A1* | 4/2007 | Misawa | ............ H01L 27/14609 348/E3.018 |
| 2008/0046181 A1 | 2/2008 | Koike et al. | |
| 2009/0102935 A1 | 4/2009 | Hung et al. | |
| 2009/0135263 A1* | 5/2009 | Sorek | .................. H04N 5/35581 348/222.1 |
| 2009/0207258 A1 | 8/2009 | Jang et al. | |
| 2010/0027847 A1 | 2/2010 | Ess et al. | |
| 2011/0109745 A1 | 5/2011 | Nakatani et al. | |
| 2011/0242378 A1* | 10/2011 | Mabuchi | ............ H04N 5/35581 348/E5.091 |
| 2012/0188411 A1 | 7/2012 | Jang | |
| 2013/0251287 A1 | 9/2013 | Kawamura et al. | |
| 2013/0271631 A1 | 10/2013 | Tatsuzawa et al. | |
| 2013/0277536 A1 | 10/2013 | Mizuno et al. | |
| 2015/0006183 A1 | 1/2015 | Daishaku | |
| 2015/0009397 A1 | 1/2015 | Yamamoto et al. | |
| 2016/0161611 A1 | 6/2016 | Ito et al. | |
| 2016/0267350 A1 | 9/2016 | Oki | |
| 2016/0307054 A1 | 10/2016 | Takemura et al. | |
| 2017/0230563 A1 | 8/2017 | Satou et al. | |
| 2019/0246053 A1 | 8/2019 | Beiley et al. | |

FOREIGN PATENT DOCUMENTS

| | | |
|---|---|---|
| JP | H3-178277 A | 8/1991 |
| JP | 10-257474 | 9/1998 |
| JP | H11-178001 A | 7/1999 |
| JP | 11-242735 | 9/1999 |
| JP | 2001-197373 A | 7/2001 |
| JP | 2002-148270 | 5/2002 |
| JP | 2007-081806 | 3/2007 |
| JP | 2008-022485 A | 1/2008 |
| JP | 2009-257982 | 11/2009 |
| JP | 2010-003253 | 1/2010 |
| JP | 2010-130254 A | 6/2010 |
| JP | 2012-088217 | 5/2012 |
| JP | 2013-150304 | 8/2013 |
| JP | 2013-223043 | 10/2013 |
| JP | 2015-095886 | 5/2015 |
| JP | 2015-133078 | 7/2015 |
| JP | 2015-158418 | 9/2015 |
| JP | 2016-225805 | 12/2016 |
| JP | 2017-005300 | 1/2017 |
| WO | 2010/004689 | 1/2010 |
| WO | 2012/086123 A1 | 6/2012 |
| WO | 2015/025497 | 2/2015 |
| WO | 2017/010047 | 1/2017 |

OTHER PUBLICATIONS

The Extended European Search Report dated Jun. 29, 2018, issued in related European Patent Application No. 16824033.1.
Notice of Allowance issued in related U.S. Appl. No. 15/497,193, dated Nov. 7, 2019.
Final Office Action issued in related U.S. Appl. No. 15/497,193, dated Jul. 19, 2019.
Non-Final Office Action issued in related U.S. Appl. No. 15/497,193, dated Mar. 15, 2019.
Non-Final Office Action issued in related U.S. Appl. No. 15/497,193, dated Oct. 18, 2018.
The Extended European Search Report dated Mar. 31, 2021 for the related European Patent Application No. 21152918.5.
Notice of Allowance issued in U.S. Appl. No. 16/217,076, dated Jun. 19, 2019.
Non-Final Office Action issued in U.S. Appl. No. 16/665,912, dated Oct. 20, 2020.
Non-Final Office Action issued in U.S. Appl. No. 16/665,912, dated Apr. 13, 2021.
Non-Final Office Action issued in U.S. Appl. No. 16/782,411, dated Oct. 29, 2020.
Notice of Allowance issued in U.S. Appl. No. 16/782,411, dated Mar. 10, 2021.
International Search Report of PCT application No. PCT/JP2018/000608 dated Mar. 27, 2018.
Communication pursuant to Article 94(3) EPC dated Apr. 20, 2021 for the related European Patent Application No. 18744680.2.
M. Murakami, et al., "Organic-Photoconductive-Film CMOS Image Sensor 120dB Wide-Dynamic-Range, Photoelectric conversion Controlled Global Shutter," ITE Technical Report vol. 40, No. 12, IST2016-20, pp. 54-56, Mar. 2016; with full machine English translation by Google Translate.
Shishido, S. et al., "210ke-Saturation Signal 3um-Pixel Variable-Sensitivity Global-Shutter Organic Photoconductive Image Sensor for Motion Capture," 2016 IEEE international Solid-State Circuits Conference, Session 6, Image Sensors, 6.2 (2016).
Non-Final Office Action issued in U.S. Appl. No. 17/243,101, dated Sep. 21, 2021.
Final Office Action issued in U.S. Appl. No. 17/243,101, dated Jan. 26, 2022.

(56) References Cited

OTHER PUBLICATIONS

Notice of Allowance issued in U.S. Appl. No. 17/243,101, dated Apr. 6, 2022.
English Translation of Chinese Search Report dated Jul. 25, 2022 for the related Chinese Patent Application No. 202110393811.2.

* cited by examiner

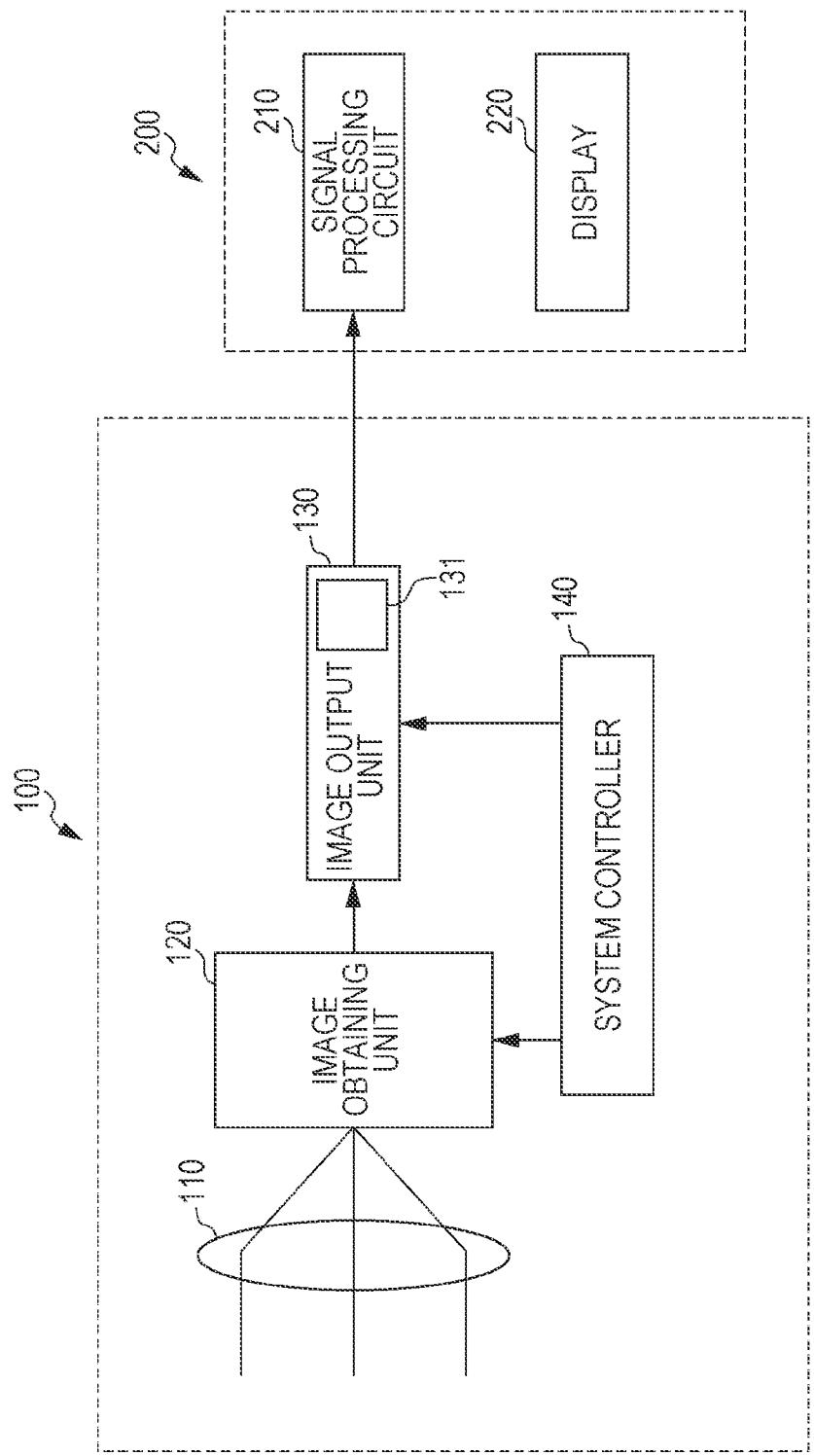

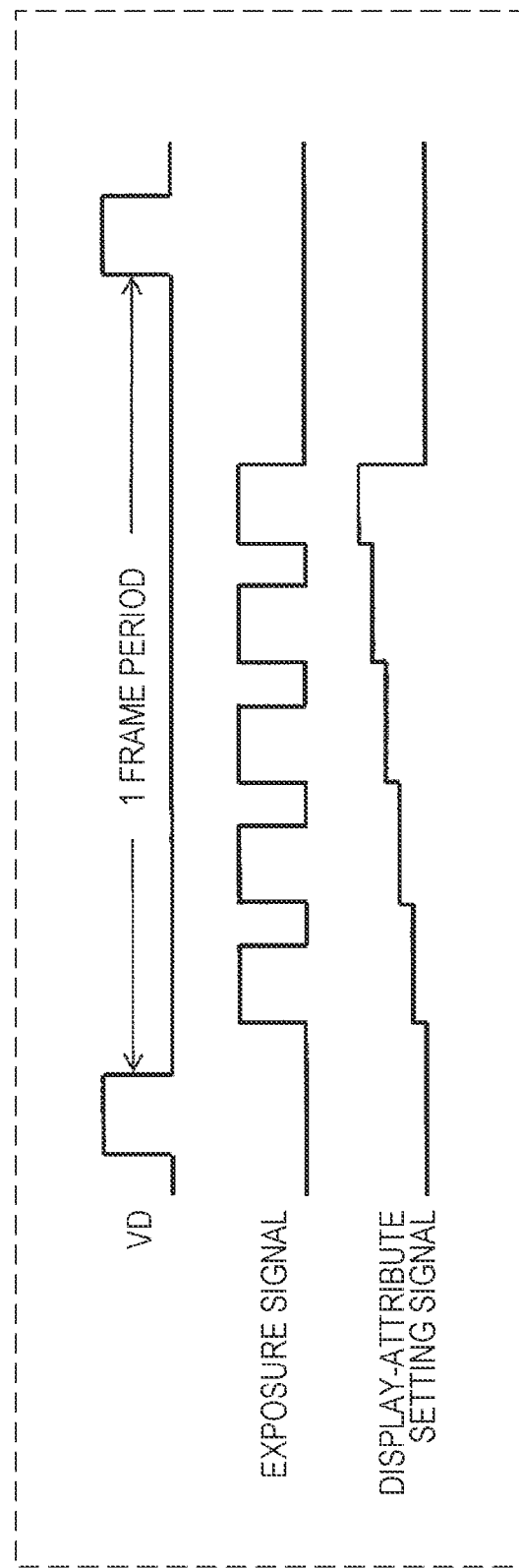

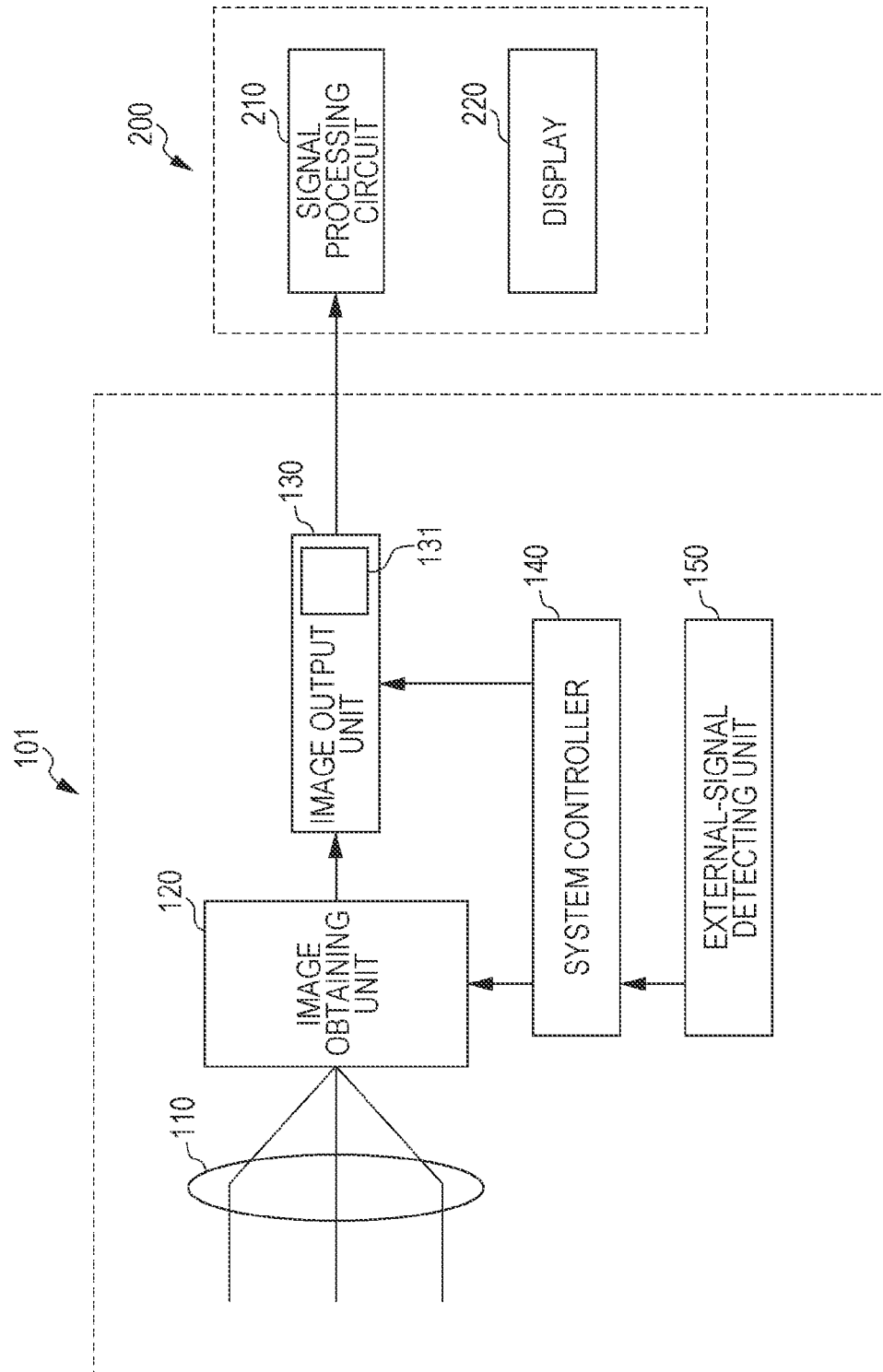

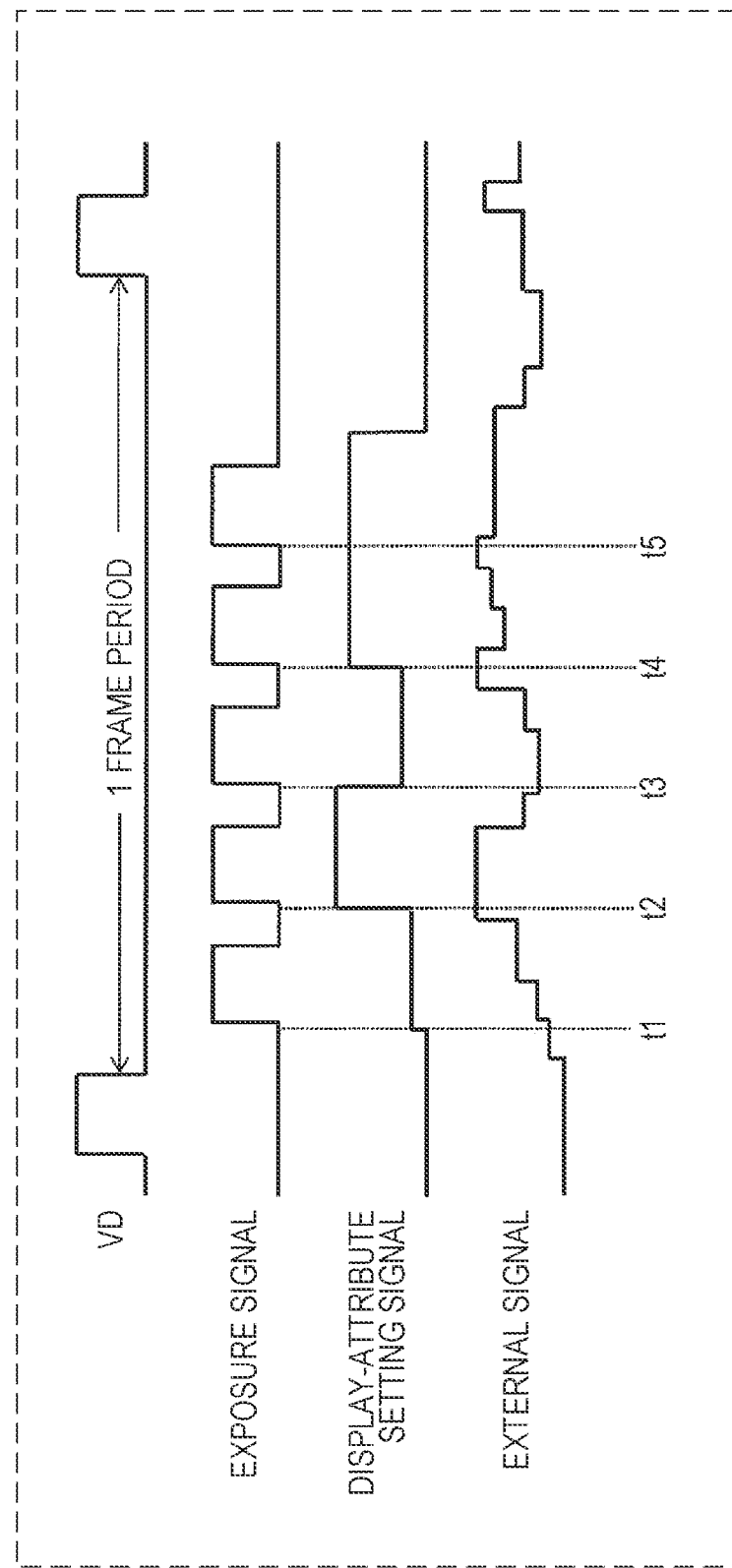

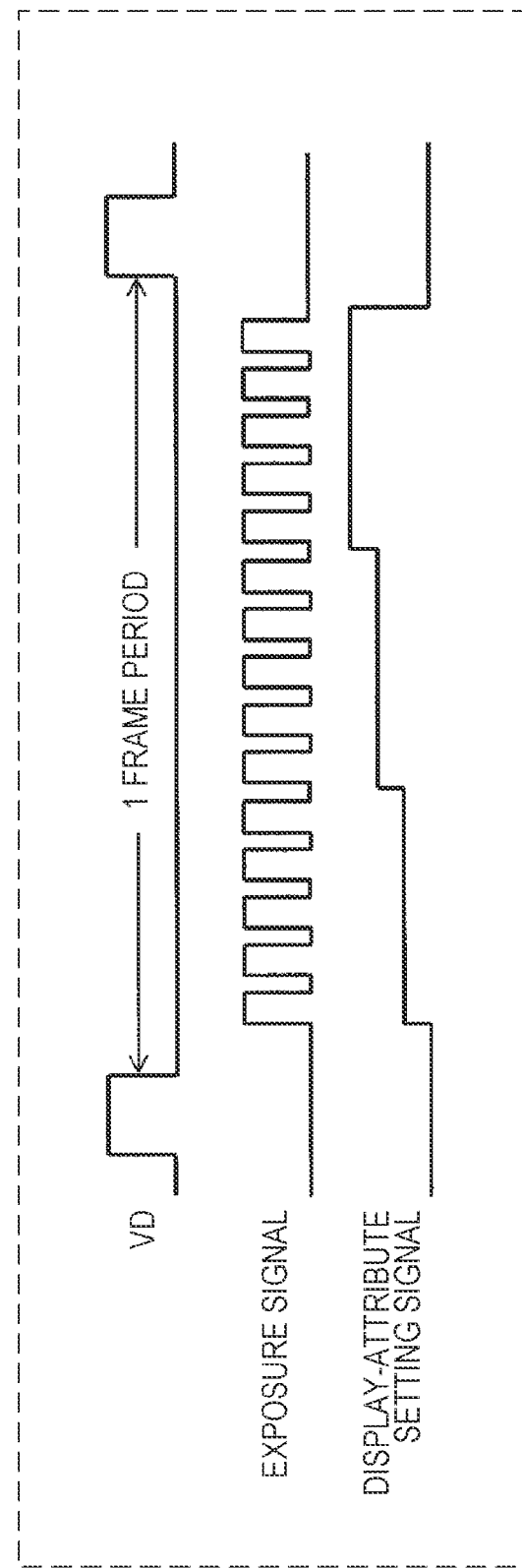

IMAGING DEVICE THAT GENERATES MULTIPLE-EXPOSURE IMAGE DATA

CROSS-REFERENCE OF RELATED APPLICATIONS

This application is a Continuation of U.S. patent application Ser. No. 17/243,101, filed on Apr. 28, 2021, which is a Continuation of U.S. patent application Ser. No. 16/782,411, filed on Feb. 5, 2020, which is a Continuation of U.S. patent application Ser. No. 15/497,193, filed on Apr. 25, 2017, now U.S. Pat. No. 10,594,948, which is a Continuation of International Application No. PCT/JP2016/002945, filed Jun. 20, 2016, which in turn claims the benefit of Japanese Application No. 2015-138393, filed on Jul. 10, 2015, the entire disclosures of which Applications are incorporated by reference herein.

BACKGROUND

1. Technical Field

The present disclosure relates to an imaging device, and particularly to an imaging device capable of performing a multiple exposure.

2. Description of the Related Art

Image capturing systems are widely used in the field of consumer goods, industrial goods, and the like. Such image capturing systems typically include imaging devices that perform a single exposure (may be referred to a "typical exposure") and a single reading during a single frame period. Imaging devices that perform a plurality of exposures and a single reading during a single frame period are also known. The plurality of exposures are typically referred to as a "multiple exposure". In a multiple exposure, image data that are obtained by sequentially capturing images are superimposed, and the superimposed image data are read as one image data.

Image data obtained with a multiple exposure include information on the change of a subject, such as motion information. In a multiple exposure, an image of a stationary subject, which does not move, such as the background, is captured in the same manner as in a typical exposure. On the other hand, in the case where an image of a moving subject is captured, the change of the moving subject can be reflected on the image data obtained with a multiple exposure. With a multiple exposure, the locus of the motion of the subject can be observed in a single image. In this manner, a multiple exposure is useful for analyzing moving subjects and for analyzing high-speed phenomena.

Japanese Unexamined Patent Application Publication No. 2001-197373 discloses an imaging device capable of capturing images with a multiple exposure (hereinafter referred to as "multiple-exposure imaging") while changing the exposure period. With the imaging device, a more natural series of images can be obtained at a high dynamic resolution.

SUMMARY

In the above-described imaging device of the related art, a further improvement has been required for imaging a moving subject.

In one general aspect, the techniques disclosed here feature an imaging device including pixels; and processing circuitry, where the pixels capture a first image in a first exposure period within a frame period and capture a second image in a second exposure period within the frame period to generate multiple-exposure image data that include the first image and the second image in a multiplexed state, the second exposure period being different from the first exposure period, the second image being different from the first image in brightness or color, and the processing circuitry detects an image of a moving subject from the multiple-exposure image data.

It should be noted that general or specific embodiments may be implemented as a system, a method, an integrated circuit, a computer program, a storage medium, or any selective combination thereof.

According to an aspect of the present disclosure, it is possible to provide an imaging device that can further improve an image of a moving subject.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 1 is a block diagram schematically illustrating the configuration of an imaging device according to a first exemplary embodiment;

FIG. 3 illustrates a typical operation timing of a multiple exposure during a single frame period;

FIG. 10 is a block diagram schematically illustrating the configuration of an imaging device according to a second exemplary embodiment;

FIG. 11 is a timing chart illustrating a typical operation timing of a multiple exposure during a single frame period;

FIG. 13A is a timing chart illustrating a typical operation timing of a multiple exposure during a single frame period;

DETAILED DESCRIPTION

Figure 2A:
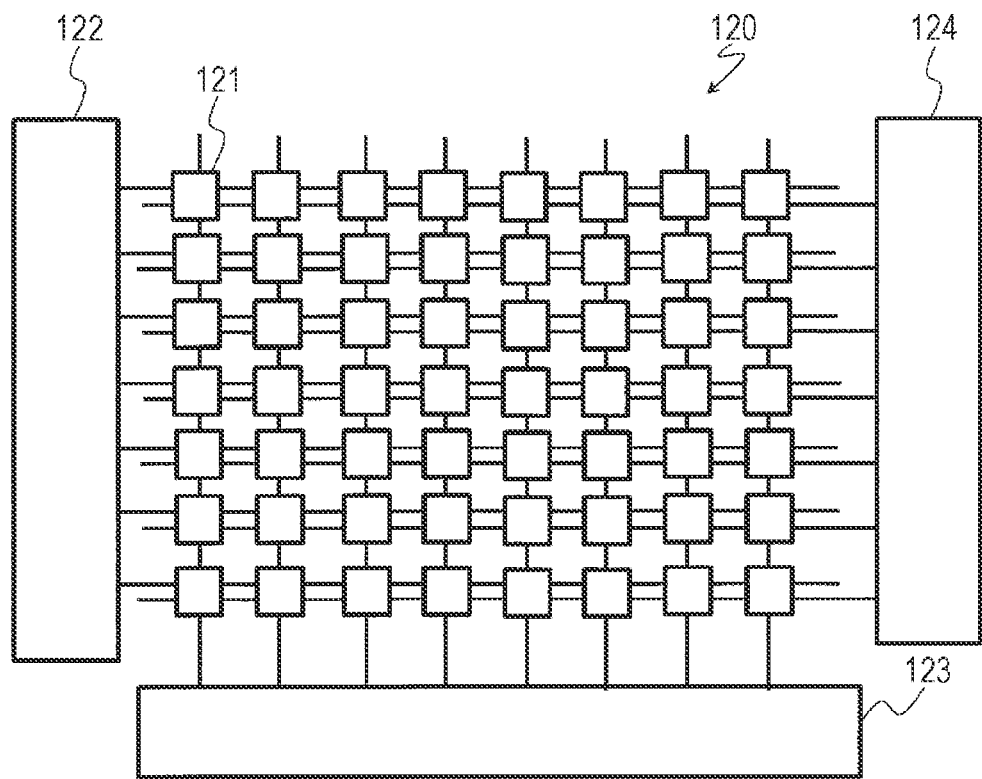
FIG. 2A is a block diagram schematically illustrating a typical configuration of an image obtaining unit.

Prior to description of embodiments of the present disclosure, issues of the related art that the present inventor has researched will be described.

For example, Japanese Unexamined Patent Application Publication No. 2001-197373 proposes a method for changing brightness of subject images in a time-series manner by changing an exposure period for each image capture of a multiple exposure. However, the exposure period is closely related to the speed of a subject. Accordingly, the usable exposure period is restricted in order to obtain a blurless image. In addition, since the exposure interval is not constant, it is not possible to capture images that are perfectly corresponding to the time base.

In view of such issues, the present inventor has arrived at an imaging device having a novel configuration.

The present disclosure encompasses imaging devices described in the following items.

Item 1

An imaging device including an image obtaining unit that obtains a plurality of image data at a plurality of timings during a single frame period and that multiplexes the plurality of image data, the plurality of image data including at least two image data having different levels of a common display attribute, and an image output unit including an output interface that outputs the image data multiplexed by the image obtaining unit.

With the imaging device according to Item 1, it is possible to determine individual image data in a time-series manner in the multiple-exposure image data.

Item 2

An imaging device including an image obtaining unit that obtains a plurality of image data at a plurality of timings during a single frame period and that multiplexes the plurality of image data, the plurality of image data including at least two image data having different levels of a common display attribute, and an image outputting unit including an output interface that demultiplexes, on the basis of subject information, the image data, which have been multiplexed by the image obtaining unit, into the image data related to each of the plurality of image data and that individually outputs at least one of the demultiplexed image data.

With the imaging device according to Item 2, it is possible to determine individual image data in a time-series manner in the multiple-exposure image data. For example, from the multiplexed image data obtained during a single frame period, moving-image data such as a frame-by-frame playback moving image can be obtained.

Item 3

The imaging device according to Item 1 or 2, wherein the levels of the common display attribute differ between each data of the plurality of image data.

Item 4

The imaging device according to any one of Items 1 to 3, wherein the common display attribute is at least one of brightness and color.

With the imaging device according to Item 4, the common display attribute can have variations.

Item 5

The imaging device according to any one of Items 1 to 4, wherein the time-series change in the level of the common display attribute is a monotonic increase or a monotonic decrease.

Item 6

The imaging device according to any one of Items 1 to 4, wherein the time-series change in the level of the common display attribute is random.

Item 7

The imaging device according to any one of Items 1 to 6, wherein the image output unit superimposes an indicator on the multiplexed image data, the indicator indicating a temporal transition during which the plurality of image data are obtained.

With the imaging device according to Item 7, since the indicator is added in addition to the difference in the level of the display attribute, it is easy to determine individual image data in a time series manner in the multiple-exposure image data.

Item 8

An imaging device including an image obtaining unit that obtains a plurality of image data at a plurality of timings during a single frame period and that multiplexes the plurality of image data, and an image outputting unit that superimposes an indicator on the image data multiplexed by the image obtaining unit, the indicator indicating a temporal transition during which the plurality of image data are obtained and that includes an output interface that outputs the superimposed image data.

With the imaging device according to Item 8, it is possible to determine individual image data in a time-series manner in the multiple-exposure image data.

Item 9

The imaging device according to any one of Items 1 to 8, wherein the image obtaining unit obtains, with a multiple exposure, the plurality of image data at a plurality of timings during a single frame period, and wherein all exposure periods in the multiple exposure are equal.

Item 10

The imaging device according to any one of Items 1 to 9, further including a display that displays an image on the basis of the image data output from the image output unit.

With the imaging device according to Item 10, it is possible to immediately observe the captured image by the display displaying the captured image.

Item 11

The imaging device according to any one of Items 1 to 10, wherein the image obtaining unit includes a pixel array in which unit pixel cells are two-dimensionally arrayed, in which each of the unit pixel cells includes a photoelectric converter that includes a first electrode, a second electrode, and a photoelectric conversion film between the first electrode and the second electrode and that performs photoelectric conversion on incident light, and a charge detection circuit that is connected to the second electrode and that detects a signal charge generated by the photoelectric converter, and in which the image obtaining unit obtains, with a global shutter and a multiple exposure, the plurality of image data at the plurality of timings during a single frame period.

With the imaging device according to Item 11, it is possible to provide the imaging device including an image sensor that includes the photoelectric converter.

Item 12

The imaging device according to Item 11, wherein the image obtaining unit changes a potential difference between the first electrode and the second electrode for each image capture with a multiple exposure.

With the imaging device according to Item 12, since the potential difference between the first electrode and the second electrode is changed, the sensitivity of each of the unit pixel cells per unit time can be changed.

Item 13

The imaging device according to Item 11, in which the sensitivity of each of the unit pixel cells per unit time is changed for each image capture with a multiple exposure.

Item 14

An imaging device comprising a unit pixel cell, wherein
the unit pixel cell captures first data in a first exposure period and captures second data in a second exposure period different from the first exposure period, the first exposure period and the second exposure period being included in a frame period,
a sensitivity per unit time of the unit pixel cell in the first exposure period is different from a sensitivity per unit time of the unit pixel cell in the second exposure period, and
the imaging device outputs multiple-exposure image data including at least the first data and the second data.

Item 15

The imaging device according to Item 14, wherein
the unit pixel cell includes
a photoelectric converter including a first electrode, a second electrode facing the first electrode, and a photoelectric conversion film between the first electrode and the second electrode, the photoelectric converter generating signal charge through photoelectric conversion, and
a signal detection circuit electrically connected to the second electrode, the signal detection circuit detecting the signal charge, and
a potential difference between the first electrode and the second electrode in the first exposure period is different from a potential difference between the first electrode and the second electrode in the second exposure period.

Item 16

The imaging device according to Item 15, further comprising a voltage control circuit that supplies a first voltage to the first electrode in the first exposure period and supplies a second voltage to the first electrode in the second exposure period, the first voltage being different from the second voltage.

Item 17

The imaging device according to Item 16, wherein the voltage control circuit supplies a third voltage to the first electrode in a non-exposure period provided between the first exposure period and the second exposure period such that the signal detection circuit does not detect the signal charge.

Item 18

The imaging device according to one of Item 14 to 17, wherein a length of the first exposure period is the same as a length of the second exposure period.

Item 19

The imaging device according to one of Item 14 to 18, wherein
the unit pixel cell captures, in the frame period, a plurality of data in a plurality of exposure periods including the first and second exposure periods, the plurality of exposure periods being different from each other, and
a sensitivity of the unit pixel cell per unit time in an earlier exposure period among the plurality of exposure periods is higher than a sensitivity of the unit pixel cell per unit time in a later exposure period among the plurality of exposure periods.

Item 20

The imaging device according to one of Item 14 to 18, wherein
the unit pixel cell captures, in the frame period, a plurality of data in a plurality of exposure periods including the first and second exposure periods, the plurality of exposure periods being different from each other, and
a sensitivity of the unit pixel cell per unit time in an earlier exposure period among the plurality of exposure periods is lower than a sensitivity of the unit pixel cell per unit time in a later exposure period among the plurality of exposure periods.

Item 21

The imaging device according to one of Item 14 to 18, wherein
the unit pixel cell captures, in the frame period, a plurality of data in a plurality of exposure periods including the first and second exposure periods, the plurality of exposure periods being different from each other, and
a sensitivity of the unit pixel cell per unit time in each of the plurality of exposure periods is set at random.

Item 22

The imaging device according to one of Item 14 to 18, further comprising a signal processing circuit that extracts, from the multiple-exposure image data, a first subject image based on the first data and a second subject image based on the second data, the first subject image and the second subject image corresponding to a moving subject.

Item 23

The imaging device according to Item 22, wherein brightness or colors of the first subject image is different from brightness or colors of the second subject image.

Item 24

The imaging device according to Item 23, wherein the signal processing circuit performs a process for correcting, on the basis of the first subject image and the second subject image, brightness or colors of the first subject image and the second subject image in the multiple-exposure image data to be same.

Item 25

The imaging device according to Item 22, wherein the signal processing circuit performs a process for adding, on the basis of the first subject image and the second subject image, an indicator indicating a temporal transition to each of the first subject image and the second subject image in the multiple-exposure image data.

According to an aspect of the present disclosure, it is possible to determine the time series of individual image data in the multiplexed image data.

Now, embodiments of the present disclosure will be described below with reference to the drawings. It should be noted that the present disclosure is not limited to the following embodiments. In addition, modification may be made as appropriate without departing from the scope of the effects of the present disclosure. Furthermore, an embodiment may be combined with another embodiment. In the following description, the same or similar components are denoted by the same reference numerals, and a repeated description may be omitted. It should also be noted that an exemplary pulse wave may have an arbitrarily set pulse interval, pulse width, pulse amplitude, and phase relationship with another signal and does not have to have the illustrated ones.

First Embodiment

1.1. Configuration of Imaging Device 100

Figure 2B:
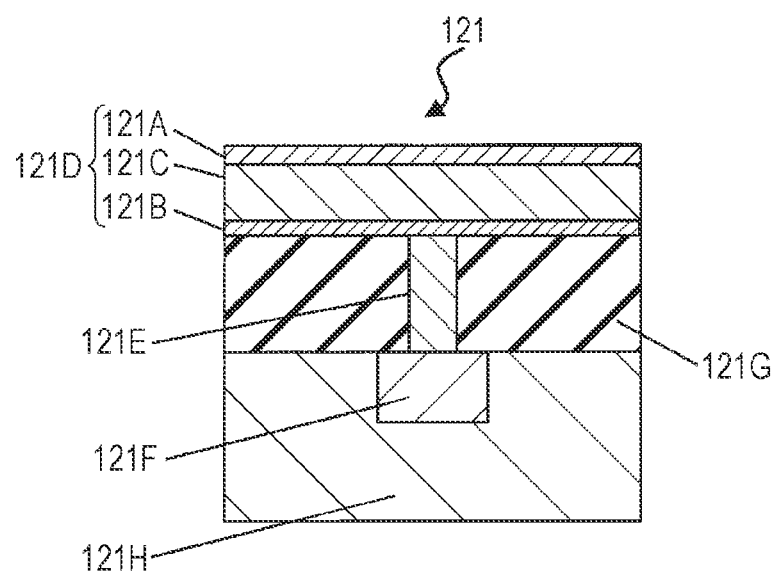
FIG. 2B schematically illustrates a cross-sectional view of a unit pixel cell.

FIG. 1 is a block diagram schematically illustrating the configuration of an imaging device 100 according to a first embodiment. FIG. 2A is a block diagram schematically illustrating a typical configuration of an image obtaining unit 120. FIG. 2B schematically illustrates a cross-sectional view of each unit pixel cell 121.

The imaging device 100 includes an optical system 110, the image obtaining unit 120, an image output unit 130, and a system controller 140.

The optical system 110 includes a diaphragm, an image-stabilizer lens, a zoom lens, a focal lens, and the like. A subject image can be enlarged and reduced by moving the zoom lens along the optical axis. In addition, the focal position of the subject image can be adjusted by moving the focal lens along the optical axis. Note that the appropriate number of lenses included in the optical system 110 is determined in accordance with required functions.

The image obtaining unit 120 is a so-called image sensor. As illustrated in FIG. 2A, for example, the image obtaining unit 120 includes a pixel array in which a plurality of unit pixel cells 121 are two-dimensionally arrayed and peripheral driving circuits. The peripheral driving circuits include a row scanning circuit 122 and a column scanning circuit 123. The plurality of unit pixel cells 121 are electrically connected to the row scanning circuit 122 and the column scanning circuit 123 via respective signal lines. The peripheral driving circuits further include a voltage control circuit 124. The voltage control circuit 124 will be described later.

As illustrated in FIG. 2B, each of the unit pixel cells 121 includes a photoelectric converter 121D for photoelectric conversion of incident light and a charge detecting circuit 121F. The photoelectric converter 121D includes a first electrode 121A, a second electrode 121B, and a photoelectric conversion film 121C between the first electrode 121A and the second electrode 121B. The charge detecting circuit 121F is provided on a semiconductor substrate 121H and is electrically connected to the second electrode 121B via a contact plug 121E in an interlayer insulating layer 121G. The charge detecting circuit 121F can detect a signal charge generated by the photoelectric converter 121D. Note that the unit pixel cell 121 is typically a stack cell including a photoelectric conversion film but may be a cell including a silicon photodiode.

The image obtaining unit 120 includes a control circuit that changes the level of a common display attribute on the basis of a control signal indicating the level of the common display attribute, that is, a control signal corresponding to the level of the common display attribute in image data to be obtained. The image obtaining unit 120 obtains, at a plurality of timings during a single frame period, a plurality of image data having different levels of the common display attribute and multiplexes the plurality of image data. That is, during a single frame period, the photoelectric converter 121D obtains, at a plurality of timings, a plurality of image data having different levels of the common display attribute. The charge detecting circuit 121F reads captured-image data including the above plurality of image data. The charge detecting circuit 121F may individually read the plurality of image data. In this case, the plurality of image data are read by the charge detecting circuit 121F and are then superimposed. The common display attribute will be described later.

The image output unit 130 includes an output buffer 131. The image output unit 130 outputs the captured-image data through the output buffer 131 to the outside. The image output unit 130 can output, to the outside, the image data multiplexed by the image obtaining unit 120.

The data output from the image output unit 130 is typically raw data and is, for example, a 12-bit signal. However, the present disclosure is not limited to this example, and the output data may be, for example, compressed data that is compressed in a manner complying with the H.264 standard, for example. The compressed data is, for example, an 8-bit signal. In this case, for example, the image output unit 130 may include a video codec that generates the compressed data in a manner complying with the H.264 standard.

The system controller 140 controls the overall imaging device 100. Specifically, the system controller 140 controls the optical system 110, the image obtaining unit 120, and the image output unit 130. The system controller 140 is typically a semiconductor integrated circuit, and is, for example, a central processing unit (CPU).

For example, the imaging device 100 may be connected to an external device 200 including a signal processing circuit 210, a display 220, and the like. Examples of the external device 200 include a personal computer, a smartphone, and the like. Specifically, the imaging device 100 is electrically connected to the signal processing circuit 210, such as a digital signal processor (DSP). The signal processing circuit 210 receives signals output from the imaging device 100 and performs a process such as gamma correction, color interpolation, space interpolation, or automatic white balance. The display 220 is, for example, a liquid crystal display or an organic electroluminescent (EL) display and displays an image on the basis of signals output from the signal processing circuit 210. Note that data output from the imaging device 100 may temporarily be stored in a recording medium such as a flash memory.

1.2. Operation of Imaging Device 100

FIG. 3 illustrates a typical operation timing of a multiple exposure during a single frame period. VD in FIG. 3 denotes a start pulse of the frame period. An exposure signal is a signal indicating whether an exposure is valid or invalid. High Period is a period during which the exposure is valid (exposure state), and Low Period is a period during which the exposure is invalid (non-exposure state). A display-attribute setting signal is a signal for setting the level of a common display attribute. The higher the set signal pulse is, the higher the level of the common display attribute is. Note that a single signal may serve as both the exposure signal and the display-attribute setting signal.

The term "common display attribute" herein refers to at least one of brightness and color. The term "brightness" means the brightness obtained on the basis of RGB signals in each pixel cell, and the term "color" means a hue or chroma obtained on the basis of RGB signals.

The pulse waveform of the exposure signal and that of the display-attribute setting signal respectively indicate the exposure period and the level of the common display attribute. Each of the pulse waveforms, that is, a control signal, is supplied to the image obtaining unit 120. The control signal may be a control signal generated by the system controller 140 or may be a control signal generated inside the image obtaining unit 120.

FIG. 3 illustrates an example in which five exposures are performed during a single frame period. The image obtaining unit 120 multiplexes a plurality of image data obtained through each image capture. In other words, one image data is obtained by superimposing the plurality of image data. An image of a subject without motion, such as the background, is captured in each exposure period by unit pixel cells 121 located at the same positions in the pixel array. Then, the image data are accumulated by the same unit pixel cells 121. On the other hand, an image of a subject with motion between respective image captures is captured by unit pixel cells 121 in the pixel array where the subject images are focused at the respective exposure timings. As a result, if different unit pixel cells 121 have been involved in image capture in all of the five exposures, the respective image data are superimposed as five independent images.

By performing each image capture by changing the level of a common display attribute in accordance with the display-attribute setting signal, it is possible to change the captured-image data obtained in each exposure period. For example, through image captures by changing the brightness of captured-image data for each image capture, it is possible to obtain a plurality of image data having different brightness. Accordingly, in the superimposed image data, the levels of the common display attribute are different between five images of the subject with motion.

Figure 4:
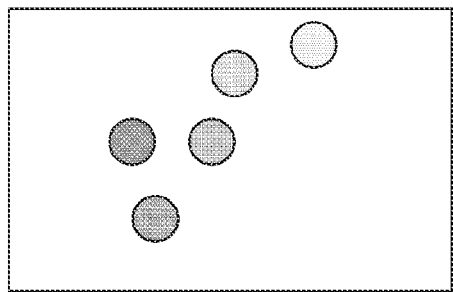
FIG. 4 schematically illustrates image data obtained with a multiple-exposure imaging.

FIG. 4 schematically illustrates the image data obtained with the multiple-exposure imaging illustrated in FIG. 3. The differences in the level of the common display attribute are individually expressed by brightness. The higher the brightness is, the later the image data is in the time series. In this manner, the time series of the obtained image data can be determined on the basis of brightness information.

The manner in which the level of the common display attribute changes is arbitrarily set (or the regularity of change is arbitrarily set). The regularity of change is determined upon starting the system, for example. Since the regularity of change is already known, it is possible to determine the time series of the images of the same subject with motion on the basis of the image data obtained with a multiple exposure in addition to the above-described example. The time-series change in the level of the common display attribute is typically a monotonic increase or a monotonic decrease. Note that the time-series change in the level of the common display attribute may be random.

As illustrated in FIG. 3, in this embodiment, all of the exposure periods for a multiple exposure are typically equal, and all of the exposure intervals are also equal during a single frame period. This point is markedly different from the related art in which the exposure period is adjusted. However, as a matter of fact, each exposure period may be changed as in the related art.

In this embodiment, instead of changing the exposure period, the sensitivity per unit time of a unit pixel cell 121 is changed for each image capture with a multiple exposure. As a result, it is possible to change the brightness and color information for each image capture. Specifically, by changing the potential difference between the first electrode 121A and the second electrode 121B of the photoelectric converter 121D, it is possible to change the sensitivity per unit time (see FIG. 2B). Such change in the sensitivity is specifically described in Japanese Unexamined Patent Application Publication No. 2007-104113, for example, the entire contents of which are herein incorporated by reference.

The manner in which the sensitivity in image captures is changed is arbitrarily set (or the regularity of change is arbitrarily set). The time-series change in the sensitivity is typically a monotonic increase or a monotonic decrease. Note that the time-series change in the sensitivity may be random.

In addition, by decreasing the potential difference between the first electrode 121A and the second electrode 121B, it is possible to prevent a charge obtained through photoelectric conversion from being detected, thereby making the sensitivity substantially zero. Accordingly, a global shutter operation can be achieved.

As described above, the image obtaining unit 120 includes a control circuit that changes the level of the common display attribute on the basis of a control signal indicating the level of the common display attribute. For example, the control circuit may be the voltage control circuit 124 (see FIG. 2A) that controls the voltage to be applied to the first electrode 121A and the second electrode 121B. The voltage control circuit 124 may be provided on the semiconductor substrate 121H or on a substrate other than the semiconductor substrate 121H. Each of the plurality of unit pixel cells 121 is electrically connected to the voltage control circuit 124 via a corresponding photoelectric-conversion-film control line. Specifically, the potential of the second electrode 121B is equal to the potential of the charge detecting circuit 121F, and the photoelectric-conversion-film control line is electrically connected to the first electrode 121A. The voltage control circuit 124 supplies a predetermined potential to the first electrode 121A on the basis of the control signal indicating the level of the common display attribute.

Figure 5:
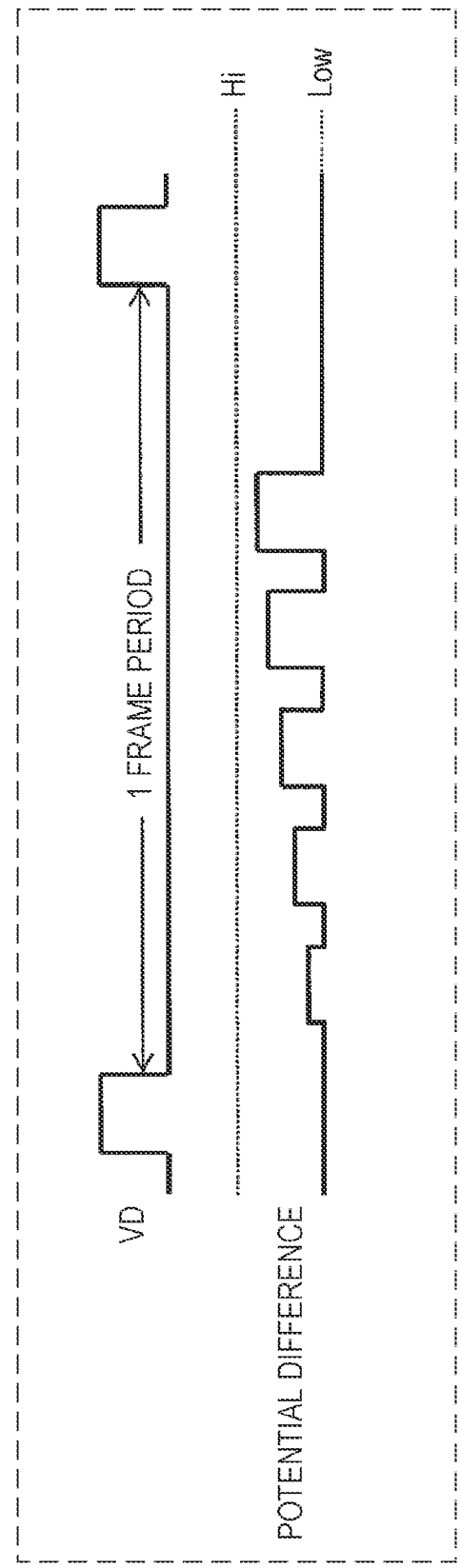
FIG. 5 is a timing chart illustrating how a potential difference between a first electrode and a second electrode in a multiple exposure during a single frame period changes (how the voltage applied to the first electrode changes)

FIG. 5 schematically illustrates how the potential difference between the first electrode 121A and the second electrode 121B in a multiple exposure during a single frame period changes (how the voltage applied to the first electrode 121A changes). In the example illustrated in FIG. 5, the level of the common display attribute corresponds to the potential difference between the first electrode 121A and the second electrode 121B. The higher a signal pulse for setting the potential difference is, the higher the potential difference is.

The Low level of the potential difference illustrated in FIG. 5 corresponds to a level at which photoelectric conversion is not performed. In other words, the Low level corresponds to a level at which a global shutter operation is implementable. The levels other than the Low level correspond to levels that are sufficiently high to perform photoelectric conversion. The High level corresponds to a level at which photoelectric conversion is performed most efficiently. Accordingly, the higher the potential difference is, the higher the sensitivity of the unit pixel cell 121 is. By repeating a cycle including the Low level and the other potential difference levels a plurality of times, a multiple-exposure imaging is performed. By changing the potential difference for each image capture, the sensitivity in each exposure period is changed.

In this manner, by changing the potential difference between the first electrode 121A and the second electrode 121B for each image capture with a multiple exposure and by performing a global shutter operation, it is possible to achieve both the multiple exposure and the change in the sensitivity for each image capture. As a result, for each image capture of a multiple exposure, it is possible to independently change the level of the common display attribute (specifically the brightness). Since images having different brightness are obtained through each image capture of a multiple exposure, it is possible to observe the time series of the images of the subject with motion in a single image data obtained by multiplexing the image data.

As described above, it is also possible to set the color as the common display attribute. In a stacked image sensor including a photoelectric conversion film, it is possible to change spectral characteristics by changing the voltage to be applied to the photoelectric conversion film. For example, according to Japanese Unexamined Patent Application Publication No. 2007-104113, by increasing and decreasing the voltage to be applied to the photoelectric conversion film corresponding to any color of R, G, and B, it is possible to increase and decrease the sensitivity for each color. Such a feature is applicable to the present disclosure. For example, in the case where the subject is white, by performing control in such a manner that the sensitivity for respective colors are reduced in the order of blue and green, it is possible to change the color of the subject in such a manner that the color temperature decreases in the order of white, yellow, and red.

For example, Japanese Unexamined Patent Application Publication No. 2009-005061 discloses a technique to change spectral characteristics by changing the bias voltage to the substrate in an image sensor including a silicon photodiode to change a charge capturing region. With this technique, if the bias voltage increases, the sensitivity for light on a long-wavelength side decreases accordingly. Such a feature is applicable to the present disclosure. For example, if the subject is white, by increasing the bias voltage, it is possible to change the color of the subject in such a manner that the color temperature increases in the order of white, light blue, and blue.

In the above manner, by using various known techniques, the color can be set as the common display attribute. By dynamically changing spectral characteristics of the unit pixel cell 121 for each image capture, it is possible to obtain a plurality of image data having different levels of a common display attribute, that is, color, at a plurality of timings during a single frame period.

Next, another embodiment of the image output unit 130 will be described. The image output unit 130 may extract images of the subject with motion from the multiple-exposure image data obtained by the image obtaining unit 120 and may separate the images into individual image data.

Figure 6:
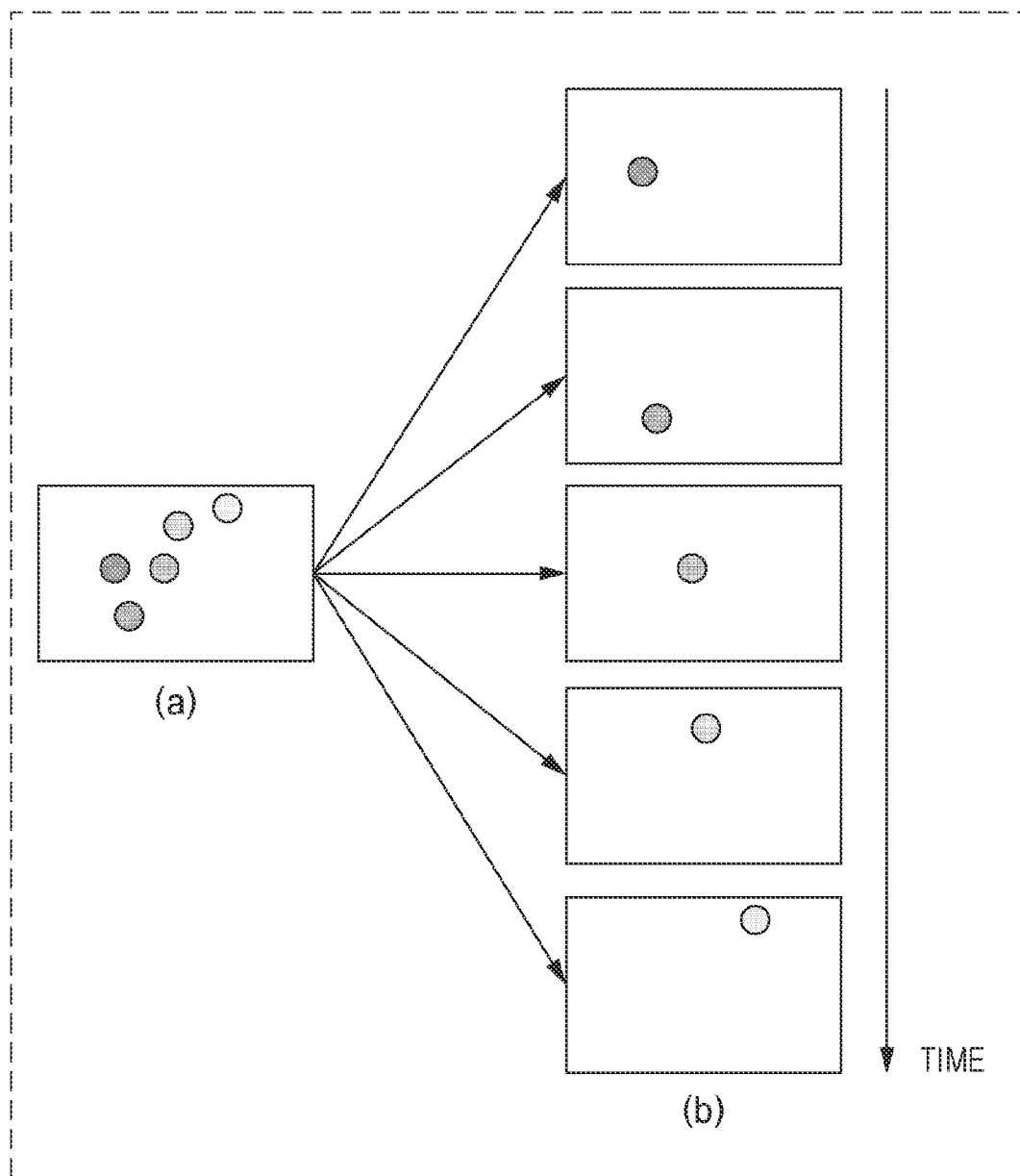
FIG. 6 schematically illustrates an image of multiple-exposure image data and images of individually separated image data.

FIG. 6 schematically illustrates the images of multiple-exposure image data and images of individually separated image data. The image data illustrated in FIG. 6(a) correspond to the multiple-exposure image data illustrated in FIG. 4.

The image obtaining unit 120 obtains a plurality of image data having different levels of the common display attribute at a plurality of timings during a single frame period and multiplexes the plurality of image data. The image output unit 130 can detect patterns of images of the same subject on the basis of subject information from the multiple-exposure image data. Examples of the subject information include patterns regarding the shape, brightness, and color of the subject, and the like. The image output unit 130 can demultiplex the multiplexed image data into individual image data on the basis of the pattern-detection results. Then, the image output unit 130 can arrange the separated individual image data in a time series manner on the basis of information on the change in the level of the common display attribute. For example, the output buffer 131 can individually output at least one of the separated image data in the order of the time series.

With such a configuration, it is possible to generate a plurality of image data each having a time order relationship on the basis of the single multiple-exposure image data. In the example illustrated in FIG. 6, an image data including five images of a circular subject illustrated in FIG. 6(a) can be separated into five individual image data illustrated in FIG. 6(b). By arranging the separated image data in a time series manner on the basis of the brightness information of each of the image data, a series of images such as a moving image can be obtained. In other words, from multiple-exposure image data obtained during a single frame period, data of a moving image such as a frame-by-frame playback moving image can be obtained.

By transmitting the moving image data to the external device 200, for example, the external device 200 can play back the data of a moving image, and the display 220 can display the frame-by-frame playback moving image. At the same time, by multiplexing the image data, it is effective in compressing the data amount to be output from the image obtaining unit 120. In addition, by performing a multiple-exposure imaging at a high speed, it is possible to obtain multiple-exposure image data including a plurality of data obtained at extremely short time intervals. Accordingly, it is also possible to play back, as a slow-motion image, a phenomenon during a period in which an image capture is difficult.

In addition, the image output unit 130 may process the plurality of image data obtained in a time series manner so as to make the levels of the common display attribute equal in order to increase the visibility. If images of the same subject with motion in multiple-exposure image data are separated into a plurality of image data and are arranged in a time series manner, the time order relationship of the image data obtained through each image capture becomes clear. For example, by using known information on the change in the level of the common display attribute, the image output unit 130 may correct all of the levels of the common display attribute of individual image data to be the maximum value. Note that all of the levels of the common display attribute of individual image data may be corrected to be the average value, for example, instead of the maximum value. Accordingly, the common display attribute does not change frame by frame among individual subject images, thereby increasing the visibility.

Figure 7:
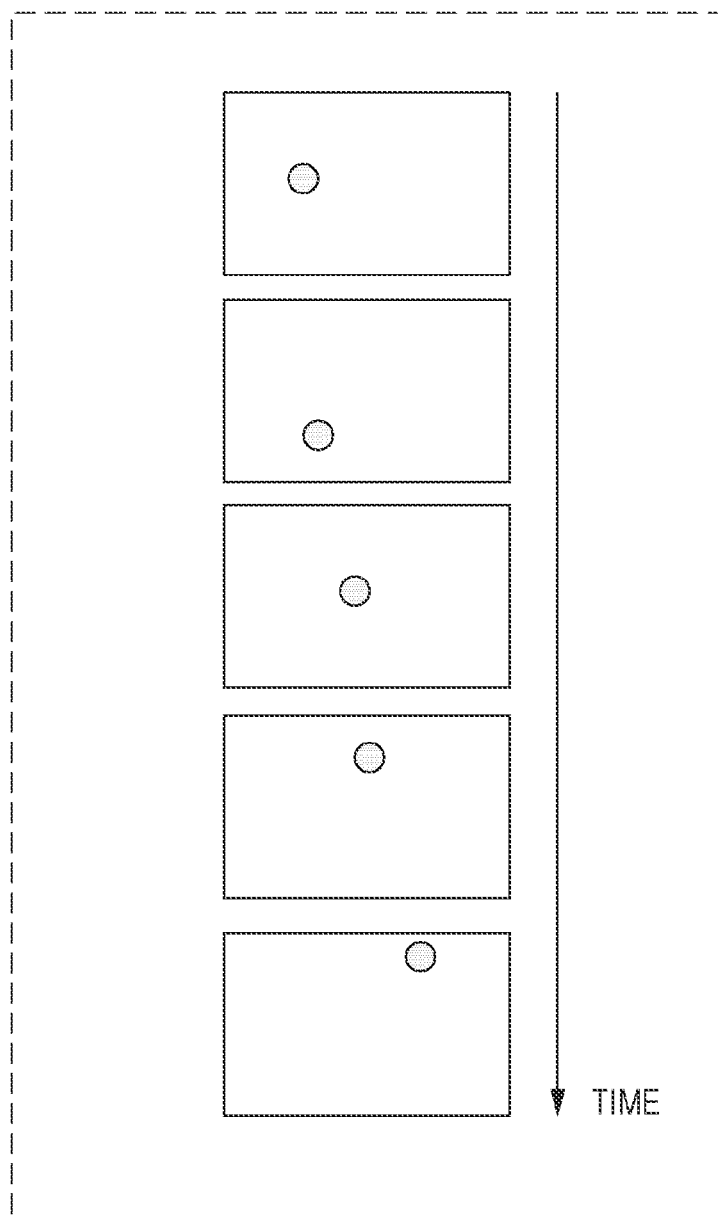
FIG. 7 schematically illustrates images of individual image data in which the levels of a common display attribute are all corrected to be the maximum value.

FIG. 7 schematically illustrates images of individual image data in which the levels of the common display attribute are all corrected to be the maximum value. Since the images of the circular subject among individual image data have the same brightness, if the image data are played back as a moving image, the impression of the moving image is improved.

Still another embodiment of the image output unit 130 will be described. The image output unit 130 can superimpose, on the multiple-exposure image data, an indicator indicating a temporal transition during which the image obtaining unit 120 obtained the plurality of image data.

Figure 8A:
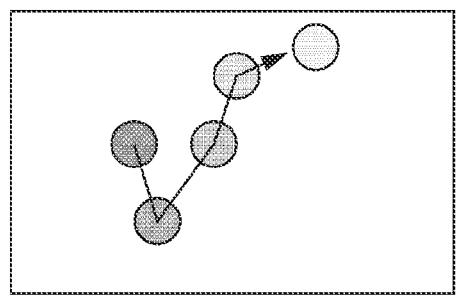
FIG. 8A illustrates an image of multiple-exposure image data with a superimposed indicator.
Figure 8B:
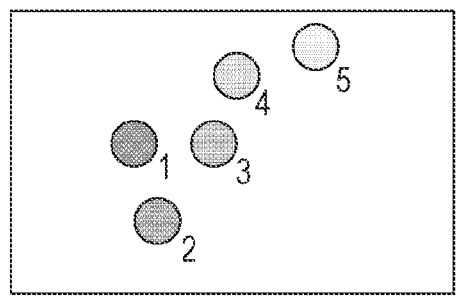
FIG. 8B illustrates an image of multiple-exposure image data with a superimposed indicator.

FIGS. 8A and 8B illustrate how the indicator is superimposed on the multiplexed image data. As illustrated in FIG. 8A, the image output unit 130 can determine the time series on the basis of information on the change in the level of the common display attribute and can superimpose an arrow indicating the temporal transition on the multiplexed image data. Alternatively, the image output unit 130 can add numerals representing the temporal transition near the subject images. Indicators are not limited to the examples illustrated in FIGS. 8A and 8B and may be alphanumeric characters, signs such as arrows, or symbols such as circles or triangles.

With such a configuration, since the indicator is added in addition to the difference in the level of the display attribute, it is easy to determine the time series of individual image data in the multiple-exposure image data.

The image output unit 130 may superimpose an indicator on the multiple-exposure image data, the indicator indicating the temporal transition during which the image obtaining unit 120 obtained the plurality of image data and may further process the plurality of image data obtained in a time series manner to have the same level of the common display attribute. Accordingly, the visibility can be further increased.

Figure 9A:
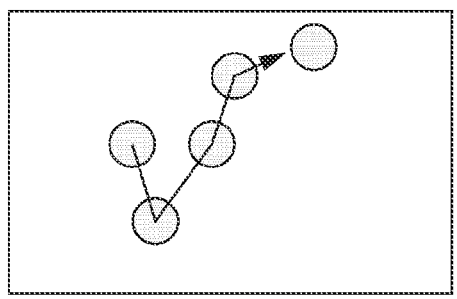
FIG. 9A schematically illustrates an image of image data that are obtained by processing the image data in FIG. 8A to have the same level of a common display attribute.
Figure 9B:
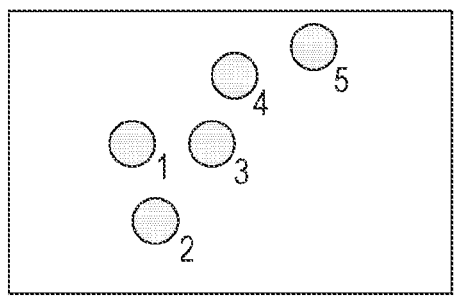
FIG. 9B schematically illustrates an image of image data that are obtained by processing the image data in FIG. 8B to have the same level of a common display attribute.

FIG. 9A schematically illustrates images of image data that are obtained by processing the image data illustrated in FIG. 8A to have the same level of the common display attribute. FIG. 9B schematically illustrates images of image data that are obtained by processing the image data illustrated in FIG. 8B to have the same level of the common display attribute.

It is sufficiently possible to determine the time series of the images illustrated in FIGS. 8A and 8B. Note that if the brightness differs for each image capture with a multiple exposure, the visibility of a subject image with a low brightness inevitably decreases. Accordingly, the image output unit 130 can correct all of the levels of the common display attribute of individual image data to be the maximum value by using known information on the change in the level of the common display attribute.

With such a configuration, the indicator makes it easier to determine individual image data in a time-series manner in the multiple-exposure image data, and further, the common display attribute does not change among individual subject images, thereby increasing the visibility.

According to this embodiment, it is possible to determine the time order relationship of images of a subject with motion or to determine a subject image that was obtained at a certain timing in multiple-exposure image data obtained during a single frame period. For example, by connecting the imaging device 100 to the external device 200, the display 220 can display the subject images on the basis of multiple-exposure image data or each of the plurality of image data.

Second Embodiment

An imaging device 101 according to a second embodiment is different from the imaging device 100 according to the first embodiment in that the imaging device 101 includes an external-signal detecting unit 150. The same parts as those of the imaging device 100 will be omitted from the following description, and most of the description refers to different parts.

2.1. Imaging Device 101

FIG. 10 is a block diagram schematically illustrating the configuration of the imaging device 101 according to the second embodiment.

The imaging device 101 includes the optical system 110, the image obtaining unit 120, the image output unit 130, the system controller 140, and the external-signal detecting unit 150.

The external-signal detecting unit 150 detects an external signal regarding the external sound, light, vibration, inclination, and the like. The external-signal detecting unit 150 transmits a display-attribute setting signal to the system controller 140 in accordance with the external signal. The display-attribute setting signal may be a binary signal of High and Low or may be an analog signal whose value changes consecutively within a fixed range. Examples of the external-signal detecting unit 150 include a photodetector, a microphone, and the like.

For example, in the case of capturing an image of a moving object that emits a sound in accordance with the internal state thereof, a microphone, which is a sound pressure detector, can be used as the external-signal detecting unit 150. As a typical mechanism, the microphone converts the sound pressure into a voltage. The conversion characteristic is expressed in units of mV/Pa, for example, and the output voltage changes linearly with respect to the sound pressure.

For example, by referring to a lookup table in which the output voltage obtained from the microphone and a display-attribute setting signal level are associated with each other, the external-signal detecting unit 150 can generate a display-attribute setting signal. Alternatively, the external-signal detecting unit 150 may transmit an external signal to the system controller 140, and the system controller 140 may refer to the lookup table to determine the level of the display-attribute setting signal in accordance with the external signal.

2.2. Operation of Imaging Device 101

FIG. 11 illustrates a typical operation timing of a multiple exposure during a single frame period. The external signal indicates a signal level detected by the external-signal detecting unit 150. In the case of using a microphone, the external signal is the above-described sound pressure. FIG. 11 illustrates discrete signal levels obtained by detecting the degree of the sound emitted from the moving object. As in the first embodiment, all of the exposure periods in the multiple exposure are equal, and all of the exposure intervals are also equal.

From the waveform of the external signal, it is found that the state of the moving object keeps changing. Time t1 to time t5 in FIG. 11 each denote a timing at which the level of the display-attribute setting signal is determined at each image capture with a multiple exposure. For example, the system controller 140 performs sampling of the external signal level before each image capture of a multiple exposure and determines the setting level of the display attribute. Each image capture is performed in accordance with the determined setting level of the display attribute.

Figure 12A:
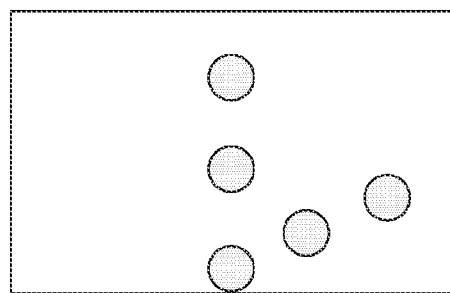
FIG. 12A schematically illustrates an exemplary image obtained with a multiple exposure.
Figure 12B:
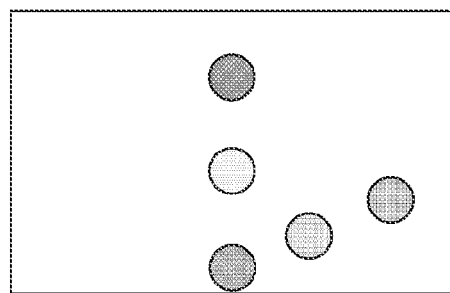
FIG. 12B schematically illustrates an exemplary image obtained with a multiple exposure.

FIGS. 12A and 12B each illustrate exemplary images obtained with a multiple exposure. The differences in the level of a common display attribute are individually expressed by brightness. That is, the differences in the degree of the sound are observed as the differences in brightness by changing the sensitivity of each unit pixel cell 121. FIG. 12A illustrates exemplary images of image data obtained with a multiple-exposure imaging of the related art, and FIG. 12B illustrates exemplary images of image data obtained with a multiple-exposure imaging by using the imaging device 101 according to this embodiment. In the related art, although the state of the moving object changed, there are no differences by which the change in the state can be observed in each subject image. In contrast, in the multiple-exposure imaging according to this embodiment, the brightness changes depending on the degree of the sound. Thus, the state change of the subject can be known by seeing the differences in each subject image.

According to this embodiment, changes of light, sound, vibration or the like, which are emitted from a subject, particularly from a moving object, and affects the exterior, can be observed from the differences in the level of the display attribute for each state.

Third Embodiment

An imaging device according to this embodiment is different from the imaging device 100 according to the first embodiment in that the imaging device changes the display-attribute setting signal at a specific timing. The imaging device according to this embodiment has the same configuration as the imaging device 100 according to the first embodiment, the block diagram of which is illustrated in FIG. 1.

FIG. 13A illustrates a typical operation timing of a multiple exposure during a single frame period. In the first embodiment, the level of the display-attribute setting signal is changed for each image capture of a multiple exposure. In this embodiment, the level of the display-attribute setting signal is changed at a specific timing. For example, as illustrated in FIG. 13A, in the case where fifteen image captures are performed during a single frame period, the fifteen image captures are divided into three groups, and the level of the display-attribute setting signal is changed for each five image captures. In this embodiment too, the time-series change in the level of the common display attribute is a monotonic increase, a monotonic decrease, or random. In the example illustrated in FIG. 13A, the time-series change is a monotonic increase.

Figure 13B:
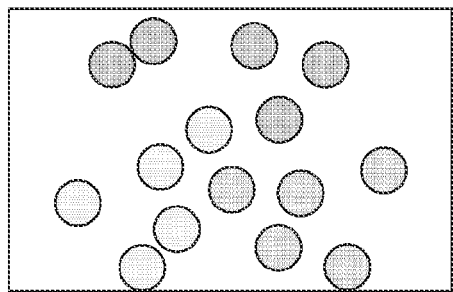
FIG. 13B schematically illustrates an exemplary image obtained with a multiple exposure.

With such an operation timing, it is possible to determine the trend of the whole movement of a subject. In the case of changing the sensitivity for each image capture in accordance with the level of the display-attribute setting signal, if the image capture is performed many times, the sensitivity may no longer have a sufficient difference for each image capture. Even in such a case, if the level of the display-attribute setting signal is changed in units of groups (e.g., for each five image captures), as illustrated in FIG. 13B, it is possible to observe both the detailed movement of the subject in each group and the whole movement in the time base among the groups.

Fourth Embodiment

An imaging device 102 according to a fourth embodiment is different from the imaging device 100 according to the first embodiment in that the imaging device 102 includes a display 180. The same parts as those of the imaging device 100 will be omitted from the following description, and most of the description refers to different parts.

Figure 14:
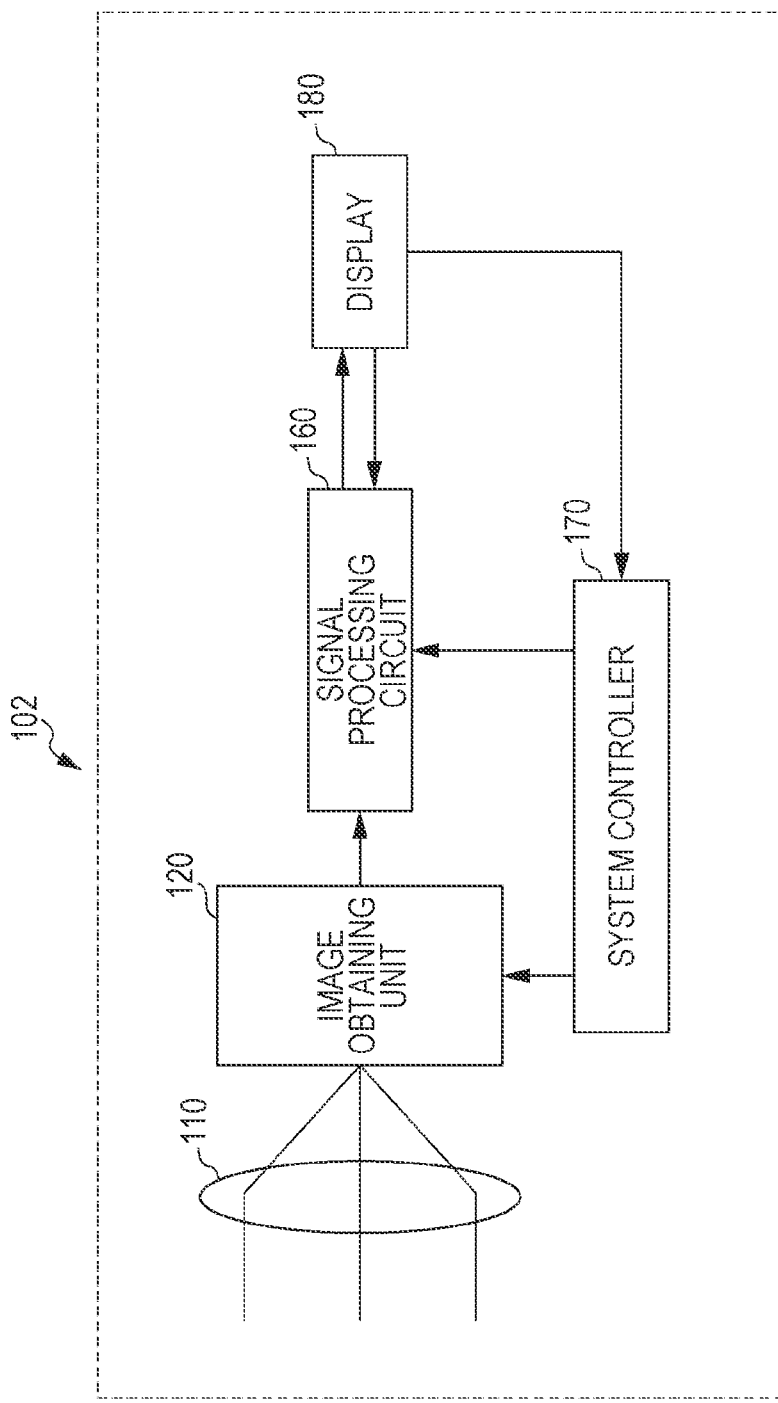
FIG. 14 is a block diagram schematically illustrating the configuration of an imaging device according to a fourth exemplary embodiment.

FIG. 14 is a block diagram schematically illustrating the configuration of the imaging device 102 according to the fourth embodiment.

Examples of the imaging device 102 include a smartphone, a digital camera, a video camera, and the like. The imaging device 102 includes the optical system 110, the image obtaining unit 120, a signal processing circuit 160, a system controller 170, and the display 180. The imaging device 102 may further include the external-signal detecting unit 150 described in the second embodiment.

The signal processing circuit 160 is, for example, a DSP. The signal processing circuit 160 receives data output from the image obtaining unit 120 and performs a process such as gamma correction, color interpolation, space interpolation, or automatic white balance. The signal processing circuit 160 has functions corresponding to the above-described image output unit 130. The signal processing circuit 160 outputs multiple-exposure image data, a plurality of separated individual image data, image data on which an indicator is superimposed, and the like.

The display 180 is, for example, a liquid crystal display or an organic EL display. The display 180 can display an image on the basis of signals output from the signal processing circuit 160. Examples of the image include the images illustrated in FIGS. 4, 6, 7, 8A, 8B, 9A, 9B, and 12B. It is needless to say that the display 180 can display an image obtained with a typical exposure.

The display 180 may include an input interface such as a touchscreen. Accordingly, by using a stylus and through the input interface, a user can select the details of a process performed by the signal processing circuit 160, can control the signal processing circuit 160, and can set conditions for an image capture performed by the image obtaining unit 120.

The system controller 170 controls the overall imaging device 102. The system controller 170 is typically a semiconductor integrated circuit, such as a CPU According to this embodiment, it is possible to immediately observe a captured image by the display 180 displaying the captured image and to perform control by using a graphical user interface (GUI) on the display 180.

An imaging device according to an embodiment of the present disclosure can be used for a digital camera, a digital video camera, a cell phone with a camera, a medical camera such as an electronic endoscope, an onboard camera, a camera for robot, and the like.

What is claimed is:

1. An imaging device, comprising:
pixels; and
processing circuitry, wherein
the pixels capture a first image in a first exposure period within a frame period and capture a second image in a second exposure period within the frame period to generate multiple-exposure image data that include the first image and the second image in a multiplexed state, the second exposure period being different from the first exposure period, the second image being different from the first image in brightness or color, and
the processing circuitry detects an image of a moving subject from the multiple-exposure image data, based on brightness or color of images of the moving subject in the multiple-exposure image data.

2. The imaging device according to claim 1, wherein the processing circuitry detects a time series of the images of the moving subject based on brightness or color of the images of the moving subject in the multiple-exposure image data.

3. The imaging device according to claim 1, wherein the processing circuitry generates first image data including the first image captured in the first exposure period from the multiple-exposure image data.

4. The imaging device according to claim 3, wherein the processing circuitry generates second image data including the second image captured in the second exposure period from the multiple-exposure image data.

5. The imaging device according to claim 4, wherein the processing circuitry performs a process for correcting color of the images of the moving subject in the multiple-exposure image data to be same, based on the first image data and the second image data.

6. The imaging device according to claim 4, wherein the processing circuitry performs a process for adding indicators indicating a temporal transition to the images of the moving subject in the multiple-exposure image data.

7. A processing device, comprising:
processing circuitry configured to receive multiple-exposure image data that include a first image and a second image in a multiplexed state, the first image being captured in a first exposure period within a frame period, the second image being captured in a second exposure period within the frame period, the second exposure period being different from the first exposure period, the second image being different from the first image in brightness or color, and the processing circuitry detects an image of a moving subject from the multiple-exposure image data, based on brightness or color of images of the moving subject in the multiple-exposure image data.

8. The processing device according to claim 7, wherein the processing circuitry detects a time series of the images of the moving subject based on brightness or color of the images of the moving subject in the multiple-exposure image data.

9. A method, comprising:

capturing a first image in a first exposure period within a frame period, capturing a second image in a second exposure period within the frame period, the second exposure period being different from the first exposure period, the second image being different from the first image in brightness or color, generating multiple-exposure image data that include the first image and the second image in a multiplexed state, and detecting an image of a moving subject from the multiple-exposure image data, based on brightness or color of images of the moving subject in the multiple-exposure image data.

10. The processing device according to claim 9, further comprising detecting a time series of the images of the moving subject based on brightness or color of the images of the moving subject in the multiple-exposure image data.

* * * * *